(12) United States Patent
Dufort

(10) Patent No.: US 6,509,781 B2
(45) Date of Patent: Jan. 21, 2003

(54) CIRCUIT AND METHOD FOR CONTROLLING A DYNAMIC, BI-DIRECTIONAL HIGH VOLTAGE ANALOG SWITCH

(75) Inventor: Benoit Dufort, Valhalla, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/812,428

(22) Filed: Mar. 20, 2001

(65) Prior Publication Data

US 2002/0135415 A1 Sep. 26, 2002

(51) Int. Cl.[7] ............................................. H03K 19/185
(52) U.S. Cl. ........................ 327/434; 327/333; 327/437; 327/108
(58) Field of Search ................. 327/333, 437, 327/434, 427, 376, 377, 442, 108

(56) References Cited

U.S. PATENT DOCUMENTS

| | | | |
|---|---|---|---|
| 4,500,802 A | 2/1985 | Janutka | 307/571 |
| 4,595,847 A | 6/1986 | Weir | 307/574 |
| 5,510,731 A | * 4/1996 | Dingwall | 327/333 |
| 5,754,074 A | * 5/1998 | Kelly | 327/434 |
| 5,886,543 A | * 3/1999 | Moody | 327/434 |
| 6,028,468 A | * 2/2000 | Menniti et al. | 327/333 |
| 6,104,229 A | * 8/2000 | Lien | 327/333 |
| 6,373,296 B1 | * 4/2002 | Auer et al. | 327/108 |

* cited by examiner

Primary Examiner—Dinh T. Le
(74) Attorney, Agent, or Firm—Steve R. Biren

(57) ABSTRACT

A circuit and method for controlling a switch include a level shifter that controls a dynamic, bi-directional high voltage analog switch. The level shifter generally includes transistors, input terminals, a voltage source, a high negative voltage source, and a diode. The configuration of the level shifter, inter alia, allows the switch to be kept ON without a current/signal, prevents dissipation of transistors of the level shifter, and provides constant gate-to-source voltage on the switch transistors for improved linearity.

38 Claims, 6 Drawing Sheets

CIRCUIT AND METHOD FOR CONTROLLING A DYNAMIC, BI-DIRECTIONAL HIGH VOLTAGE ANALOG SWITCH

BACKGROUND OF THE INVENTION

1. Technical Field

The present invention generally relates to a circuit and method for controlling a switch. In particular, the present invention relates to a level shifter for controlling a dynamic, bi-directional high voltage analog switch.

2. Background Art

In the field of ultrasound imaging applications, switches are often utilized in the scanhead to reduce the number of co-axial cables. In order for the switches and the underlying electronic devices to have optimal performance, various factors must be considered. For example, it is important for the gate-to-source voltage of each switch transistor to be constant in order for the switch to have high linearity during conduction. This ensures a minimum of signal distortion that would be detrimental to the image quality.

Heretofore many have attempted to implement various systems for controlling a switch. Two such examples are illustrated in U.S. Pat. No. 4,500,802 to Janutka and U.S. Pat. No. 4,595,847 to Weir. However, no existing switch system is dynamic and allows zero DC bias current independent of switch state (i.e., ON or OFF). Specifically, none of the existing technologies allow the switch to be kept on by the charge on the gates of the switch transistors (i.e., a current is not required to keep the switch on, only to turn it on initially) while preventing the voltage in the switch from dissipating. In addition, as electronic devices continue to shrink in size, the need to produce smaller electrical components grows. However, no existing product provides a switch that can reach high voltages (e.g., 200 Volts) while occupying smaller amounts (e.g., 50%) of silicon area. Furthermore, no existing product can provide a switch that can reach 500 Volts in a configuration suited for ultrasound electronics. Still yet, none of the existing technologies provide a system for controlling operation of the switch that requires lower voltage positive power supplies (e.g., 5 Volts and/or 12 Volts). In contrast, the existing control systems typically require voltages commensurate with that passing through the switch (e.g., +100 Volts).

In view of the forgoing, there exists a need for a switching circuit and method whereby: (1) the switch can reach higher voltages (e.g., 500 Volts) while occupying a silicon area suitable for ultrasound applications; and (2) the switch can reach available voltages (e.g., 200 Volts) while occupying less area (e.g. 50%) of silicon. Moreover, there exists a need for a circuit and method that is dynamic and allows zero DC bias current independent of whether the switch is ON or OFF. This will allow the switch to remain ON by the charge on the gates of the switch transistors and will prevent power dissipation from the transistors once charged. A further need exists for a circuit and method that allows the gate-to-source voltage on the switch transistors to remain constant so that any non-linearities of the switch are reduced. A need also exists for a circuit and method that requires lower power supplies for controlling operation of the switch.

SUMMARY OF THE INVENTION

The present invention overcomes the drawbacks of existing systems by providing a circuit and method for controlling a dynamic, bi-directional high voltage analog switch. In particular, the circuit and method of the present invention include the switch and a level shifter for controlling the switch. The level shifter generally includes a voltage source, a high negative voltage source, input terminals, transistors, and a diode. Collectively the circuit and method provide, among other things: (1) a dynamic circuit that allows zero DC bias current independent of switch state; (2) a constant gate-to-source voltage; (3) increased switch voltages while reducing silicon surface area occupied; and (4) lower voltage power supplies for driving the circuit.

According to a first aspect of the present invention, a circuit for controlling a switch is provided. The circuit comprises: (1) a level shifter, wherein the level shifter includes: (a) a first level transistor coupled to a switch line; (b) a diode positioned between the first level transistor and the switch line; (c) a second level transistor coupled to a current mirror, wherein the current mirror is coupled to the switch line; and (2) a switch coupled to the switch line, wherein the level shifter controls the switch.

According to a second aspect of the present invention, a circuit for controlling a dynamic, bi-directional high voltage analog switch is provided. The circuit comprises: (1) a level shifter including: (a) a first level transistor coupled to a switch line; (b) a first input terminal coupled to the first level transistor; (c) a diode coupled between the first level transistor and the switch line; (d) a second level transistor coupled to a current mirror, wherein the current mirror is coupled to the switch line; (e) a second input terminal coupled to the second level transistor; and (2) a dynamic, bi-directional high voltage analog switch including: (a) a first switch transistor; (b) a switch input terminal coupled to the first switch transistor; (c) a second switch transistor coupled to the first switch transistor; (d) a switch output terminal coupled to the second switch transistor; and (e) a Zener diode coupled between the first and second switch transistors.

According to a third aspect of the present invention, a method for controlling a bi-directional switch having a Zener diode and a plurality of switch transistors with a level shifter is provided. The method comprises the steps of: (1) setting a first input terminal of the level shifter to approximately 0 Volts, wherein the first input terminal is coupled to a first level transistor; (2) setting a second input terminal of the level shifter to approximately 12 Volts, wherein the second input terminal is coupled to a second level transistor; (3) passing a control signal from a voltage source through the first level transistor and a diode of the level shifter to the bi-directional switch; (4) charging the Zener diode and the switch transistors with the control signal; (5) passing a switch signal from a switch input to a switch output when the Zener diode exceeds a threshold voltage of the switch transistors; and (6) ceasing the control signal when a gate potential of the switch transistors reaches a predetermined potential.

Therefore, the present invention provides a circuit and method for controlling a dynamic, bi-directional high voltage analog switch. The present invention reduces the problems associated with existing systems set forth above.

BRIEF DESCRIPTION OF THE DRAWINGS

These and other features and advantages of this invention will be more readily understood from the following detailed description of the various aspects of the invention taken in conjunction with the accompanying drawings in which:

FIG. 2 depicts a graph of simulation results when the switch of the present invention is ON.

FIG. 4 depicts a graph of oscilloscope traces when the switch of the present invention is ON.

Figure 1:
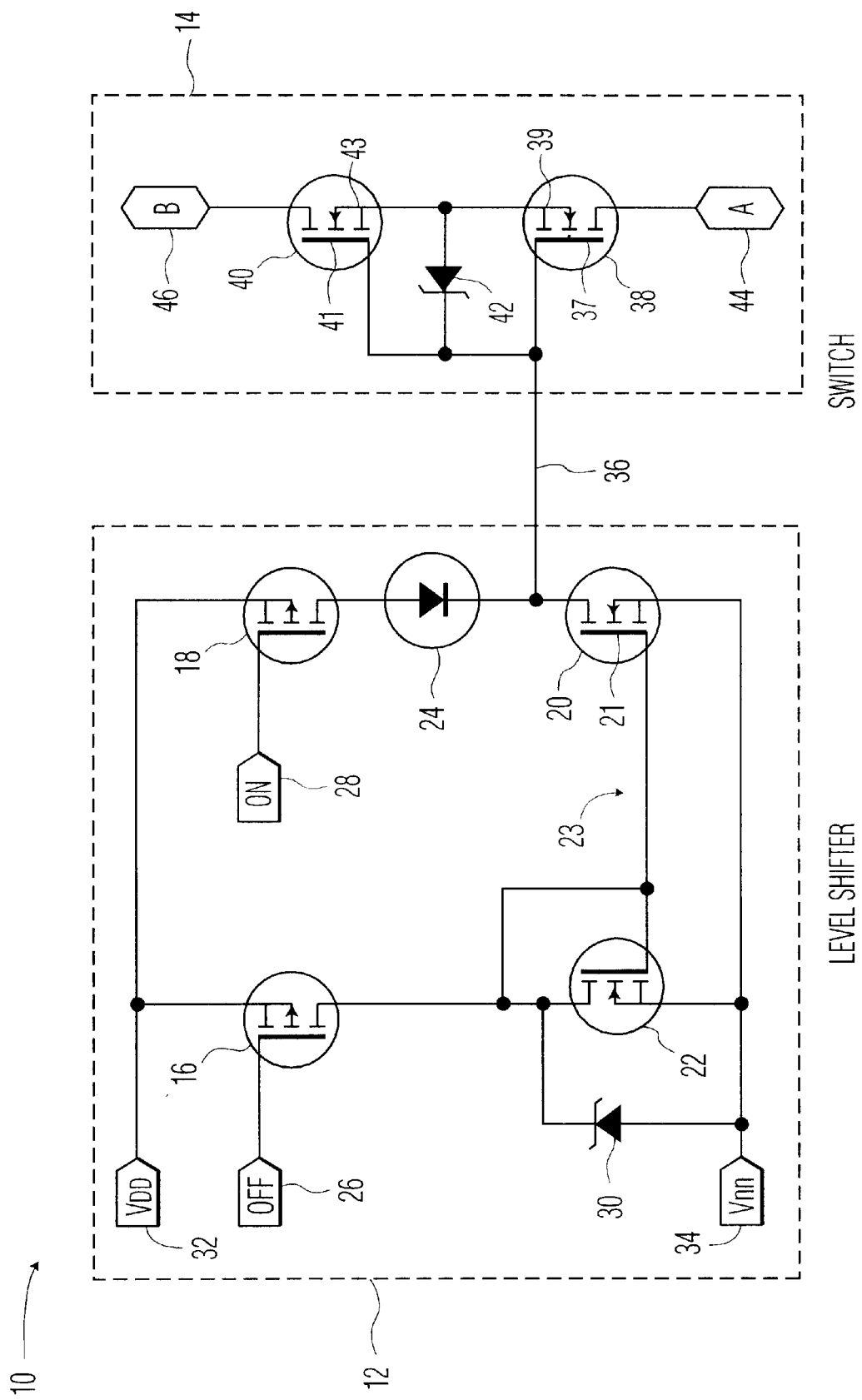
FIG. 1 depicts a circuit according to the present invention.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

For clarity purposes, the description will have the following sections:
I. Circuit Configuration
II. Circuit Operation
III. Experimental Results

I. CIRCUIT CONFIGURATION

Referring now to FIG. 1, a circuit 10 having a level shifter 12 and a switch 14 connected by switch line 36 is depicted. Level shifter 12 preferably includes level transistors 16, 18, 20, and 22, diode 24, input terminals 26, and 28, Zener diode 30, voltage source 32, and high negative voltage source 34. Collectively, transistors 20, 22 and Zener diode 30 comprise a current mirror 23 that is coupled to switch line 36 (as will be described in further detail below). Level transistors 16 and 18 are preferably PDMOS lateral high voltage transistors, level transistor 20 is preferably a NDMOS lateral high voltage transistor, and level transistor 22 is preferably a low voltage NDMOS transistor. Diode 24 is a high voltage diode. Zener diode 30 is a protection device to keep the ground-to-source and drain-to-source voltages of transistor 22 below 14 Volts and preferably has a Zener potential/voltage of approximately 12 Volts. Input terminal 28 is designated as an ON terminal and controls the flow of a control signal (i.e., a current) from voltage source 32 through transistor 18 and diode 24. Similarly, input terminal OFF 26 controls the flow of the control signal from voltage source 32 through transistors 16, and 22 and the flow of a signal from high negative voltage source 34 through transistor 20. High negative voltage source 34 provides the maximum negative voltages that switch 14 lets through during operation. Under the teachings of the present embodiment, this voltage can be as low as −250 Volts. Diode 24 ensures the control signal will flow from transistor 18 to switch 14 and not vice versa. This prevents the dissipation of power from switch 14, as will be further described below. The configuration of the circuit 10 permits voltage source 32 to be a low voltage (e.g., 12 Volt) power source. In previous systems, the voltage source 32 used to control switch 14 was required to be substantially higher than 12 Volts. Such a requirement adds expense to the circuit.

Switch 14 is preferably a dynamic, bi-directional high voltage analog switch that includes switch transistors 38 and 40 (preferably coupled source-to-source), and Zener diode 42. Switch transistors 38 and 40 are preferably NDMOS lateral high voltage transistors and Zener diode 42 preferably has a Zener potential/voltage of approximately 12 Volts. Switch 14 is dynamic because it does not require a current (i.e., a signal flow) to be kept ON, rather a current is required only to turn the switch 14 ON initially. Moreover, since switch 14 is bi-directional, a signal through switch 14 can flow either from switch terminal A 44 to switch terminal B 46 or vice versa. Accordingly, either switch terminal 44 or 46 can be the input terminal or the output terminal. In addition, switch 14 is considered high voltage because it can pass voltages of approximately +250 Volts to −250 Volts. It should be understood that although switch 14 and level shifter 12 are shown with specific components, other variations might exist. For example, switch 14 could include additional switch transistors. Moreover, it should be appreciated that although switch 14 is preferably a dynamic, bi-directional high voltage analog switch, other types of switches could be controlled according to the teachings of the present invention. For example, switch 14 might not be dynamic, high voltage and/or bi-directional.

II. CIRCUIT OPERATION

The above-described circuit 10 will function in the following manner. To place the switch in a low impedance mode (i.e., ON), the input terminal ON 28 is set to 0 Volts while the input terminal OFF 26 is set to 12 Volts. A control signal (i.e., a current) will pass from voltage source 32, through level transistor 18 and diode 24, pass into switch 14 through switch line 36, and begin to "charge" the parasitic capacitances (i.e., gates 37 and 41) of switch transistors 38 and 40 as well as Zener diode 42. As this is occurring, the setting of OFF input terminal 26 to 12 Volts prevents the control signal from flowing from voltage source 32 through level transistors 16, 20, and 22. Moreover, the voltage at gate 21 of level transistor 20 is set to its threshold voltage (e.g., Vt=2.5 Volts).

Once Zener diode 42 potential exceeds the threshold voltage (e.g., Vt=2.5 Volts) of switch transistors 38 and 40, the signal from switch input terminal A 44 is allowed to flow through switch transistors 38 and 40 to switch output terminal B 46 (or vice versa since switch 14 is bi-directional). Thus, the sources 39 and 43 of switch transistors 38 and 40, as well as switch output terminal B 46 will rise to the potential at switch input terminal A 44. When sources 39 and 43 have reached the potential at switch input terminal A 44, the current through level transistor 18 and diode 24 will charge the Zener diode 42 and the gates 37 and 41 of switch transistors 38 and 40 to approximately 12 Volts (e.g., the Zener potential). Once the gates 37 and 41 have reached this voltage, the drain-to-source potential of level transistor 18 is equal to 0 Volts and the control signal will stop flowing therethrough. Accordingly, no current is flowing anywhere in circuit 10, thereby reducing power consumption to 0. At this point, switch 14 is in low impedance mode and no further current is required to maintain this mode.

If a positive voltage switch signal is then applied to switch input terminal A 44, sources 39 and 43, gates 37, and 41, as well as switch output terminal B 46 will follow switch input terminal A 44. Specifically, the switch signal from switch input terminal A 44 would flow through switch transistors 38 and 40 to switch output terminal B 46. Moreover, since diode 24 is reverse biased, the parasitic gate capacitances of switch transistors 39 and 43 will keep their charge (i.e. 12 Volts), so that linearity is maintained (i.e. switch 14 is dynamic). The maximum positive voltage that can be applied to switch input terminal A 44 is equal to the maximum voltage that diode 24 can sustain.

If a negative voltage switch signal is applied to switch input terminal A 44, sources 39 and 43, gates 37 and 41, as well as switch output terminal B 46 will similarly follow switch input terminal A 44. However, in this case, the control signal will flow from voltage source 32 through level transistor 18, diode 24, and Zener diode 42. Zener diode 42 will keep the gate-to-source potential of switch transistors 38 and 40 at the Zener potential (i.e., approximately 12 Volts). Thus, similar to when a positive voltage is applied to switch input terminal A 44, the gate-to-source potential of switch transistors 38 and 40 remains constant (i.e., at 12 Volts in this case). Any current in the circuit 10 can then flow out through either switch terminal A 44 or switch terminal B 46.

To place switch 14 in high impedance mode (i.e., OFF), input terminal ON 28 is set to 12 Volts and input terminal OFF 26 is set to 0 Volts. Then, a control signal will flow from voltage source 32 and through level transistors 16 and 22. Since gate 21 of level transistor 20 is coupled to level transistor 22, a high negative voltage will pass from high negative voltage source 34 through level transistor 20 and switch line 36 to switch 14. However, since input terminal ON 28 is set to 12 Volts, no signal will flow there through. The high negative voltage through level transistor 20 will discharge the parasitic gate capacitances of switch transistors 38 and 40. When the gate-to-source potential of switch transistors 38 and 40 is equal to the threshold voltage (e.g., Vt=2.5 Volts) of switch transistors 38 and 40, switch 14 is in high impedance mode (i.e., OFF). The high negative voltage will continue to discharge the parasitic capacitances of switch transistors 38 and 40 through level transistor 20 and Zener diode 42. When the potential at sources 39 and 43 and gates 37 and 41 reaches the high negative voltage (Vnn) of approximately −250 Volts, the control signal will stop flowing. through level transistor 20. In this mode, switch 14 can block signals at switch terminals A 44 and B 46. To this end, the maximum positive voltage that can be applied to switch terminals A 44 or B 46 depends on the maximum drain-to-source that voltage switch transistors 38 and 40 can sustain. Conversely, the minimum voltage that can be applied to switch terminals A 44 or B 46 is equal to Vnn (−250 Volts).

In the case where switch 14 is in high impedance mode and a voltage less than approximately 1 Volt peak appears at switch terminal A 44 or B 46, which is typical in ultrasound applications during receiving, both input terminal OFF 26 and input terminal ON 28 can be set to 12 Volts. At this point, the control signal will stop flowing through level transistors 16 and 22 and the gate potential of level transistor 20 will drop, thus, placing level transistor 20 in high impedance. Since there is now no path to discharge the parasitic capacitances of switch transistors 38 and 40, they will remain in high impedance mode. Moreover, since there is no signal flowing (i.e., current) anywhere in the circuit 10, power consumption is reduced to 0.

As indicated above, it should be understood that although switch terminals A 44 and B 46 have been described as the input and output, respectively, the terminals could be reversed. Specifically, switch terminal B 46 could be the input while switch terminal A 44 could be the output. Moreover, the control signals passed through level shifter 12 are approximately 12 Volts. However, it should be understood that other voltages could be utilized depending on the size of level transistors 16 and 18.

III. Experimental Results

Figure 2:
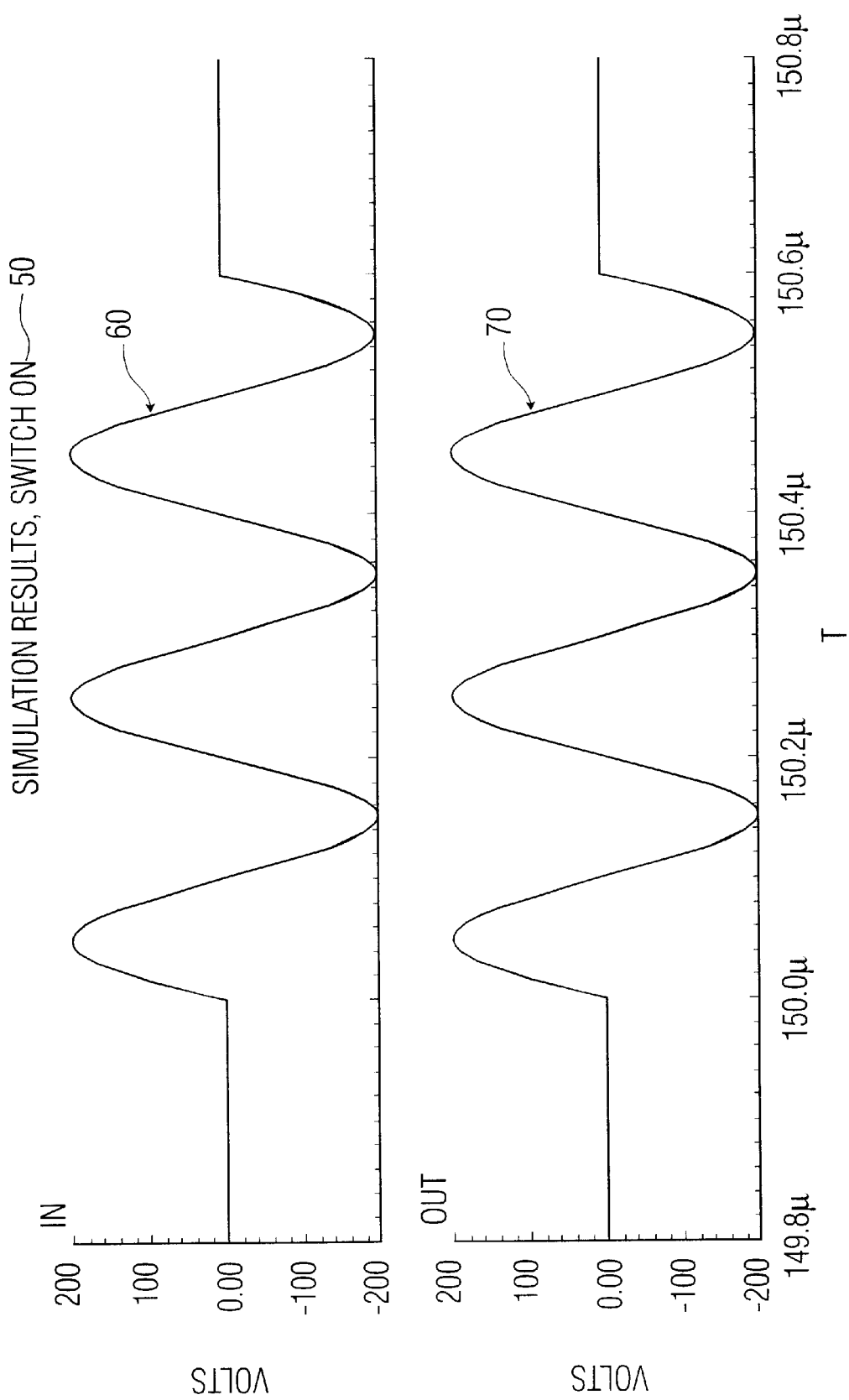

Referring now to FIG. 2, a graph 50 of simulation results with the switch ON is depicted. In particular, graph 50 depicts two plots 60 and 70 of transient response in terms of voltage versus time in micro-seconds. Plot 60 depicts the transient response at the switch input terminal of circuit, while plot 70 shows transient response at the switch output terminal. As can be seen, when the switch of the present invention is ON, the transient response at the switch input terminal is approximately the same as the transient response of the switch output terminal. This linearity is provided by the constant gate-to-source voltage of the switch transistors and was lacking in previous systems.

Figure 3:
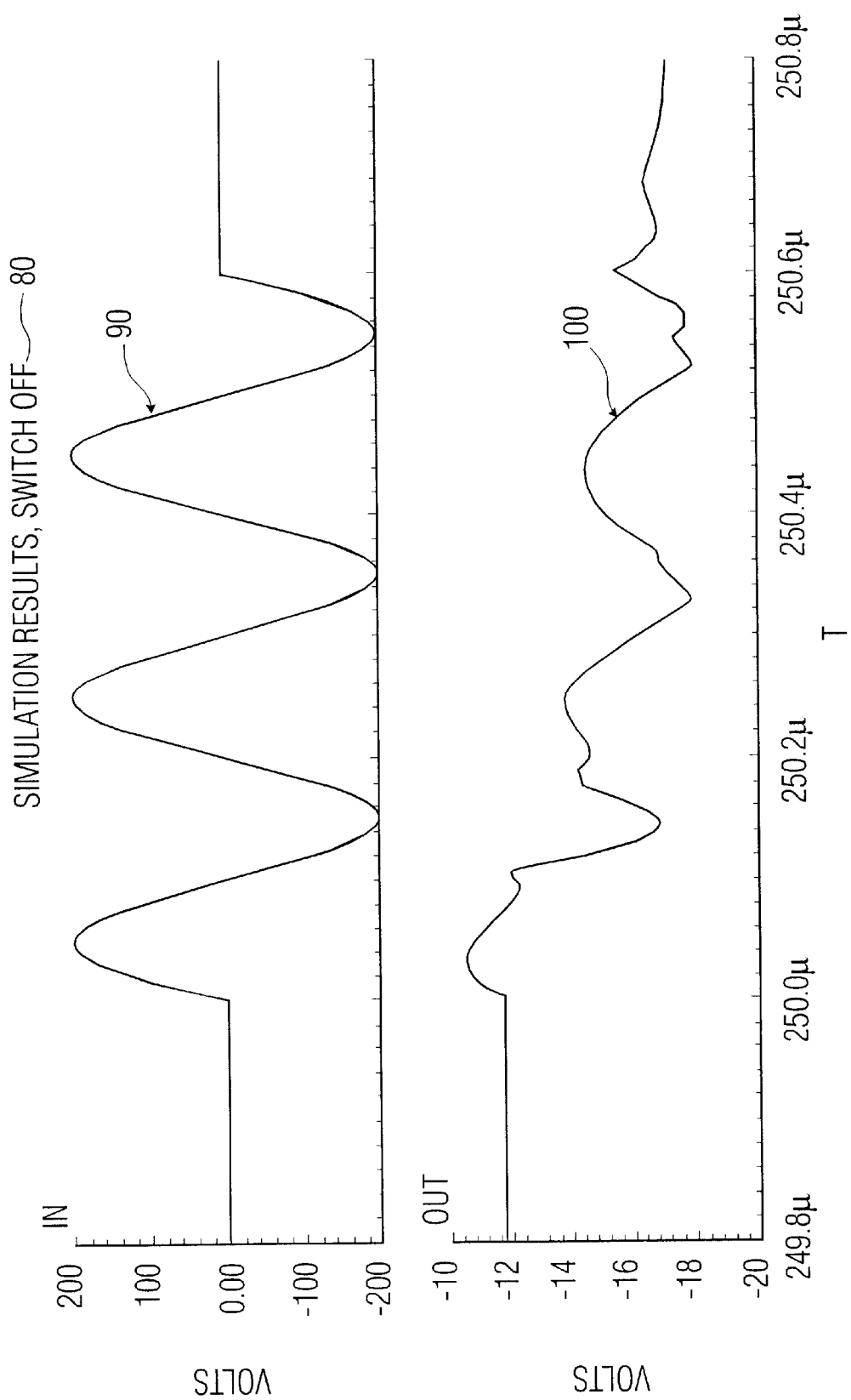
FIG. 3 depicts a graph of simulation results when the switch of the present invention is OFF.

FIG. 3 shows a graph 80 of simulation results with the switch OFF. Similar to above, graph 80 comprises two plots 90 and 100 showing the transient response of circuit in terms of voltage versus time. Plot 90 depicts the transient response at the switch input terminal while plot 100 depicts the transient response at the switch output terminal. As shown, when the switch is OFF, the high impedance mode described above prevents the switch signal from passing from the input to the output terminal of the switch.

Figure 4:
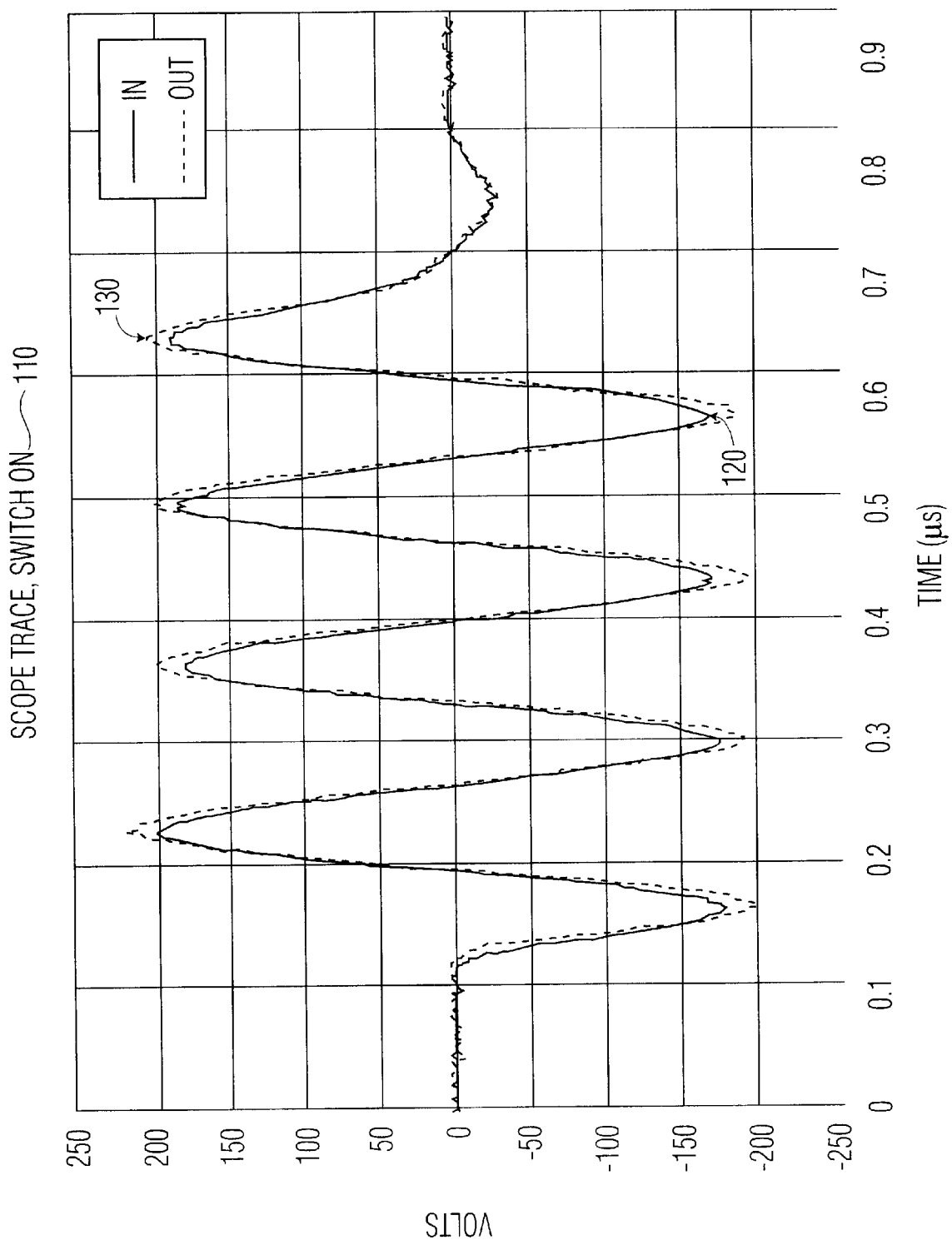

FIG. 4 depicts a graph 110 of oscilloscope traces when the switch is ON. Similar to the above graphs, graph 110 depicts two plots 120 and 130 in terms of voltage versus time. Plot 120 depicts the voltage at the input terminal of the switch, while plot 130 depicts the voltage at the output terminal of the switch. Due to the configuration of the circuit of the present invention (i.e., the level shifter and its control over the switch), the scope trace at the switch input terminal and the switch output terminal are nearly identical.

Figure 5:
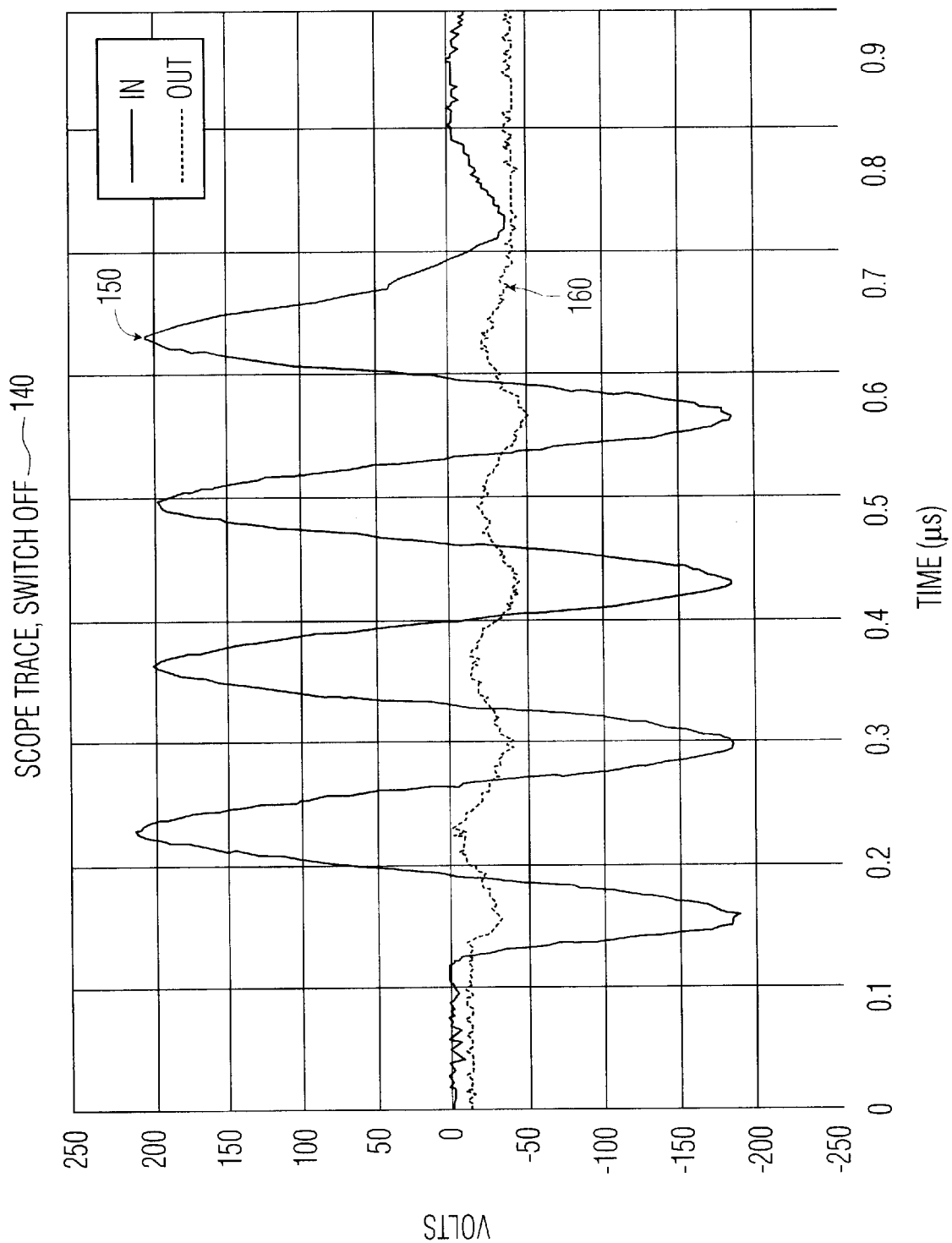
FIG. 5 depicts a graph of oscilloscope traces when the switch of the present invention is OFF.

Referring to FIG. 5, it can be seen that this is not the case when the switch is OFF. Specifically, FIG. 5 shows a graph 140 of oscilloscope traces when the switch is OFF. In observing the two plots 150 and 160, it can be seen that the voltage at the switch output terminal 160 is relatively flat compared to the voltage at the switch input terminal 150, which indicates that the high impedance mode of the switch blocks the switch signal. This is desired when the switch is OFF as shown in FIG. 5.

Figure 6:
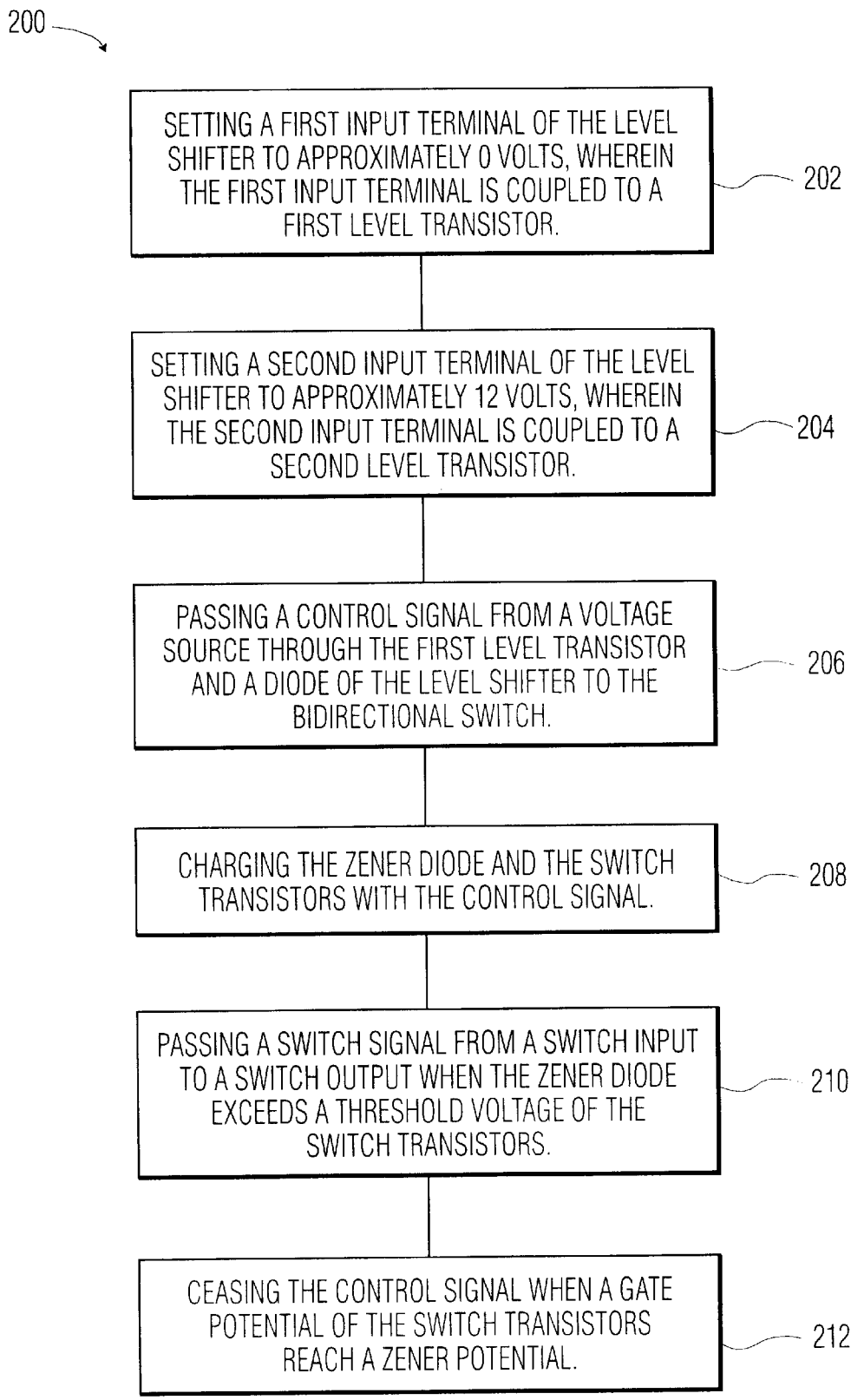
FIG. 6 depicts a method flow chart in accordance with the present invention.

Referring now to FIG. 6, a flow chart of a method 200 is shown. First step 202 of method is to set a first input terminal of the level shifter to approximately 0 volts, wherein the first input terminal is coupled to a first level transistor. Second step 204 is to set a second input terminal of the level shifter to approximately 12 volts, wherein the second input terminal is coupled to a second level transistor. Third step 206 of method 200 is to pass a control signal from a voltage source through the first level transistor and a diode of the level shifter to the bi-directional switch. Fourth step 208 is to charge the Zener diode and the switch transistors with the control signal. Fifth step 210 is to pass a switch signal from a switch input to a switch output when the Zener diode exceeds a threshold voltage of the switch transistors. Sixth step 212 of method 200 is to cease the control signal when a gate potential of the switch transistors reaches a predetermined potential.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A circuit for controlling a switch, comprising:
a level shifter, wherein the level shifter includes:

a first level transistor coupled to a switch line via a diode;

a second level transistor coupled to a current mirror, wherein the current mirror is coupled to the switch line; and a switch coupled to the switch line, wherein the level shifter controls the switch.

2. The circuit of claim 1, wherein the first and second level transistors are PDMOS lateral high voltage transistors.

3. The circuit of claim 1, wherein the current mirror comprises a third and a fourth level transistor and a Zener diode, and wherein the third level transistor is a low voltage NDMOS transistor and the fourth level transistor is a NDMOS lateral high voltage transistor.

4. The circuit of claim 1, wherein the switch is a dynamic, bi-directional high voltage analog switch that comprises a first switch transistor, a second switch transistor, a Zener diode, a switch input terminal and a switch output terminal.

5. The circuit of claim 4, wherein a source of the first switch transistor is coupled to a source of the second switch transistor, and wherein the Zener diode is coupled between the first and second switch transistors.

6. The circuit of claim 1, wherein the level shifter further comprises a first input terminal coupled to the first level transistor; and a second input terminal;coupled to the second level transistor.

7. The circuit of claim 6, wherein the switch is placed in a low impedance mode when the first input terminal is set to approximately 0 Volts and the second input terminal is set to approximately 12 Volts.

8. The circuit of claim 6, wherein the switch is placed in a high impedance mode when the first input terminal is set to approximately 12 Volts and the second input terminal is set to approximately 0 Volts.

9. The circuit of claim 6, wherein the switch is placed in a high impedance mode when both input terminals are set to approximately 12 Volts.

10. The circuit of claim 1, wherein the level shifter further comprises:

a voltage source for providing a control signal to the first and second level transistors; and a high negative voltage source for providing a high negative voltage to the current mirror and the switch.

11. The circuit as claimed in claim 1 wherein the switch comprises transistor switch means having at least a control electrode and a first main electrode, and means for holding substantially constant the control electrode/first main electrode voltage of the transistor switch means in both the on and off states of the transistor switch means.

12. The circuit as claimed in claim 11 wherein the constant voltage holding means comprises at least a Zener diode coupled to the control electrode and first main electrode of the transistor switch means.

13. The circuit as claimed in claim 1 wherein the current mirror is coupled to the switch line via a circuit path exclusive of the diode.

14. The circuit as claimed in claim 1 wherein the switch is coupled to first and second input/output terminals for controlling current flow therebetween.

15. The circuit as claimed in claim 1 wherein the level shifter controls the switch via the switch line.

16. The circuit as claimed in claim 15 wherein the level shifter further comprises first and second signal control terminals coupled to respective control electrodes of the first and second level transistors thereby to control switching of the switch via the first and second level transistors and the switch line.

17. The circuit as claimed in claim 1 wherein the diode is polarized in a direction so as to prevent current flow from the switch line to the first level transistor.

18. The circuit as claimed in claim 17 wherein the diode is a high voltage diode such that the switch can control a voltage greater than the voltage level of the level shifter in normal operation of the circuit and switch.

19. The circuit as claimed in claim 1 wherein the switch comprises a bi-directional high voltage analog switch including transistor switch means having a gate and source and with the transistor switch means coupled between first and second input/output terminals, and means including a Zener diode coupled between the gate and source of the transistor switch means for holding substantially constant the gate/source voltage in both the on and off states of the transistor switch means.

20. The circuit as claimed in claim 19 wherein the level shifter further comprises;

a first voltage source line coupled to the switch line via the first level transistor and the diode, a second voltage source line coupled to the switch line via the current mirror, and first and second signal control terminals coupled to respective control electrodes of the first and second level transistors thereby to control switching of the switch via the first and second level transistors and the switch line.

21. The circuit as claimed in claim 1 wherein the switch comprises first and second switch transistors coupled source to source in series between first and second input/output terminals, and the diode is polarized in a direction so as to prevent current flow from the switch line to the first level transistor so that a charge voltage is produced across the gate parasitic capacitance of the first and second switching transistors thereby to provide a constant gate/source voltage on said switch transistors which allow said switch transistors to be kept on without a current signal for the gates thereof.

22. The circuit as claimed in claim 1 wherein the switch is a bi-directional high voltage analog switch coupled to first and second high voltage input/output terminals for controlling current flow therebetween.

23. A circuit for controlling a dynamic, bi-directional high voltage analog switch, comprising:

a level shifter including:

a first level transistor coupled to a switch line;

a first input terminal coupled to the first level transistor;

a diode coupled between the first level transistor and the switch line;

a second level transistor coupled to a current mirror, wherein the current mirror is coupled to the switch line;

a second input terminal coupled to the second level transistor; and a dynamic, bi-directional high voltage analog switch including:

a first switch transistor;

a switch input terminal coupled to the first switch transistor;

a second switch transistor coupled to the first switch transistor;

a switch output terminal coupled to the second switch transistor; and a Zener diode coupled between the first and second switch transistors.

24. The circuit of claim 23, wherein the first and second level transistors are PDMOS lateral high voltage transistors.

25. The circuit of claim 23, wherein the first and second switch transistors are NDMOS lateral high voltage transistors.

26. The circuit of claim 23, wherein the Zener diode has a Zener potential of approximately 12 Volts.

27. The circuit of claim 23, wherein the current mirror comprises a third level transistor, a fourth level transistor, and a second Zener diode, wherein the third level transistor is a low voltage NDMOS transistor and the fourth level transistor is a NDMOS lateral high voltage transistor.

28. The circuit of claim 23, wherein the switch is placed in low impedance mode by setting the first input terminal to approximately 0 Volts and the second input terminal to approximately 12 Volts.

29. The circuit of claim 23, wherein the switch is placed in high impedance mode by setting the first input terminal to approximately 12 Volts and the second input terminal to approximately 0 Volts.

30. The circuit of claim 23, wherein the level shifter further comprises:

a voltage source for providing a control signal to the first and second level transistors; and a high negative voltage source for providing a high negative voltage to the current mirror and the switch.

31. The circuit of claim 23, wherein the switch is capable of passing signals of approximately +250 to −250 Volts.

32. A method for controlling a bi-directional switch having a Zener diode and a plurality of switch transistors with a level shifter, comprising the steps of:

setting a first input terminal of the level shifter to approximately 0 Volts, wherein the first input terminal is coupled to a first level transistor;

setting a second input terminal of the level shifter to approximately 12 Volts, wherein the second input terminal is coupled to a second level transistor;

passing a control signal from a voltage source through the first level transistor and a diode of the level shifter to the bi-directional switch;

charging the Zener diode and the switch transistors with the control signal;

passing a switch signal from a switch input to a switch output when the Zener diode exceeds a threshold voltage of the switch transistors; and ceasing the control signal when a gate potential of the switch transistors reaches a predetermined potential.

33. The method of claim 32, wherein a gate to source voltage of the switch transistors is constant.

34. The method of claim 32, further comprising the steps of:

setting the first input terminal to approximately 12 Volts;

setting the second input terminal to approximately 0 Volts; and passing a high negative voltage from the level shifter to the switch.

35. The method of claim 34, wherein the step of passing a control signal comprises passing a control signal from the level shifter to the switch transistors and the Zener diode.

36. The method of claim 32, further comprising setting both input terminals to approximately 12 Volts when a low voltage switch signal is applied to the switch input.

37. The method of claim 32, wherein the predetermined potential is approximately 12 Volts.

38. The method of claim 32, further comprising the step of sending a switch signal through the switch.

* * * * *